United States Patent [19]

Yakushiji

[11] 4,321,284
[45] Mar. 23, 1982

[54] MANUFACTURING METHOD FOR SEMICONDUCTOR DEVICE

[75] Inventor: Hisao Yakushiji, Itami, Japan

[73] Assignee: Vlsi Technology Research Association, Kanagawa, Japan

[21] Appl. No.: 110,169

[22] Filed: Jan. 7, 1980

[30] Foreign Application Priority Data

Jan. 10, 1979 [JP] Japan .................................. 54/2063

[51] Int. Cl.³ ........................................... H01L 21/88
[52] U.S. Cl. ...................................... 427/89; 156/643; 156/653; 156/657; 427/90; 427/93; 427/94; 427/96; 430/314
[58] Field of Search ....................... 427/89, 90, 94, 96, 427/93; 156/643, 653, 657

[56] References Cited

U.S. PATENT DOCUMENTS

| | | | |
|---|---|---|---|
| 3,801,880 | 4/1974 | Harada et al. | 427/96 |
| 3,844,831 | 10/1974 | Cass et al. | 427/89 |
| 3,976,524 | 8/1976 | Feng | 427/96 |
| 4,025,411 | 5/1977 | Hom-Ma et al. | 156/643 |
| 4,045,594 | 8/1977 | Maddocks | 427/96 |
| 4,070,501 | 1/1978 | Corbin et al. | 427/96 |
| 4,076,575 | 2/1978 | Chang | 427/96 |
| 4,123,565 | 10/1978 | Sumitomo et al. | 427/89 |
| 4,172,004 | 10/1979 | Alcorn et al. | 156/643 |
| 4,174,251 | 11/1979 | Pashke | 156/643 |
| 4,184,909 | 1/1980 | Chang et al. | 156/643 |

*Primary Examiner*—John D. Smith
*Attorney, Agent, or Firm*—Sughrue, Mion, Zinn, Macpeak and Seas

[57] ABSTRACT

A method for manufacturing semiconductor devices having a multi-layer wiring interconnection structure wherein a first interconnection wiring metal layer is formed on a semiconductor substrate followed by the formation of layers of silicon nitride on portions wherein patterns are to be placed and forming a layer of silicon oxide over the layer of silicon nitride. Selective portions of the silicon oxide layer are removed by lightly etching the layer to form recesses around the wiring portions of the metal layer. The silicon nitride layer is then removed and an insulating layer is formed on the surface from which the silicon nitride layer was removed. Through-holes are formed in predetermined portions of the insulating layer through which contact is made to a second wiring metal layer disposed over the insulating layer.

6 Claims, 10 Drawing Figures

MANUFACTURING METHOD FOR SEMICONDUCTOR DEVICE

BACKGROUND OF THE INVENTION

The invention relates to a method for manufacturing a semiconductor device having a multi-layered wiring interconnection structure.

In a semiconductor integrated circuit, a number of circuit elements are formed on a semiconductor substrate in a limited surface area making it impossible to connect the circuits with planar wiring interconnection techniques. Therefore, multi-layered wiring structures have been employed.

FIGS. 1A–1D are a series of cross-sectional views of a semiconductor device having a conventional multi-layered wiring structure and showing steps in the method employed for producing this structure. In FIG. 1A, a silicon oxide layer 2 is formed on a surface of a semiconductor substrate 1. On the oxide layer 2, an aluminum layer 3 is vapor-deposited which forms a first wiring metal layer. Then, a resist pattern 4 is formed on portions of the aluminum layer 3 which are to be left for forming the interconnection wiring layers photolithographically. FIG. 1A shows this state.

Thereafter, the aluminum layer 3 is etched using the resist layer 4 as a mask after which the mask is removed leaving the wiring layer 3a of aluminum as shown in FIG. 1B. A silicon oxide layer 5 is then formed on the silicon oxide layer 2 and the wiring layer 3a using a CVD technique. The device at this stage is shown in FIG. 1C.

Thereafter, an aluminum layer 6 which forms a second wiring metal layer is vapor-deposited on the silicon oxide layer 5. In this case, since a recessed portion is formed in the silicon oxide layer 5 due to the existence of the wiring layer 3a, the aluminum layer 6 has a tendency to crack around the recessed portion as shown in FIG. 1D, the crack being indicated by reference numeral 6a. These cracks 6a may cause breaking of the wiring layers. For this reason, the yield of such products is considerably lowered due to breaking of the wiring layers before use or the breaking of the wiring layers after long periods of use due to electromigration.

SUMMARY OF THE INVENTION

An object of the present invention is thus to provide a method of manufacturing semiconductor devices which is reliable and in which breaking of the wiring layers is prevented so that, accordingly, a high yield is provided.

In accordance with the invention there is provided a method for manufacturing a semiconductor device including the steps of forming a first interconnection wiring metal layer on a semiconductor substrate, forming a silicon nitride layer on wiring portions of the first wiring metal layer, forming a silicon oxide layer on the silicon nitride layer, selectively removing the silicon oxide layer by etching, removing the silicon nitride layer, forming an insulating layer on a surface from which the silicon nitride layer was removed, forming through-holes in predetermined positions through an insulating layer, and forming a second wiring metal layer on the insulating layer, the second wiring metal being connected to the first wiring metal layer through the through-holes. For selectively etching the silicon oxide layer, it is preferred that the silicon oxide layer be etched lightly so as to form recesses around the wiring portions of the metal layer. Chemical etching with a fluoric acid may be used.

DESCRIPTION OF THE PREFERRED EMBODIMENTS

Figure 1A:
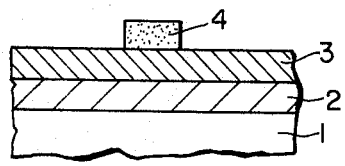
FIGS. 1A–1D show a series of cross-sectional views of a semiconductor device in various steps in a conventional manufacturing process.

FIGS. 2A–2F show cross-sectional views of a semiconductor device of the present invention in various steps of the manufacturing process of the method of the invention. In FIGS. 2A–2F, the same structures in common with those of FIG. 1 are indicated by the same reference numerals at those used in FIG. 1.

Figure 2A:
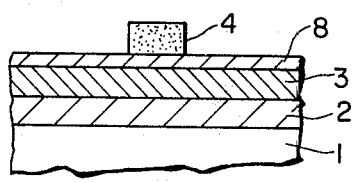
FIGS. 2A–2F show a series of cross-sectional views of a semiconductor device in various steps of the manufacture according to the method of the present invention.
Figure 1B:
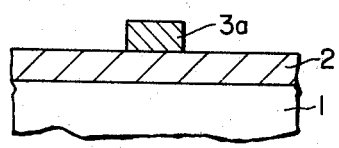
Figure 2B:
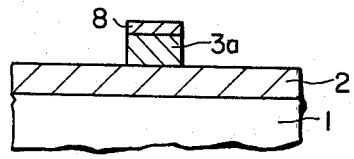
Figure 1C:
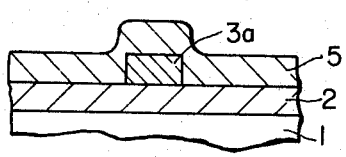
Figure 2C:
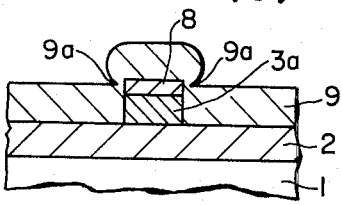
Figure 1D:
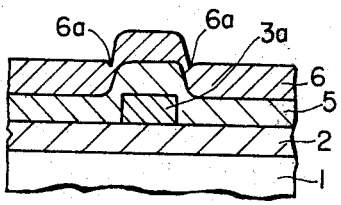

Firstly, a silicon oxide layer 2 is formed on a surface of a silicon substrate 1 and an aluminum layer 3 is vapor-deposited on the silicon oxide layer 2 to form a first interconnection wiring metal layer. Then, a silicon nitride layer 8 having a thickness on the order of 500–5000 Å is formed upon the aluminum layer 3 using a plasma CVD technique. Thereafter, a photoresist layer 4 is photolithographically formed over portions of the aluminum layer 3 which are to be left to from a wiring layer. FIG. 2A shows this stage. Following this, the silicon nitride layer 8 is selectively etched through the photoresist mask 4 using an etchant such as $CF_4$ gas. The mask 4 is removed and then the aluminum layer 3 is selectively etched away using the selectively-etched silicon nitride layer 8 as a mask for wiring layer 3a. FIG. 2B shows the device at this stage of construction.

Then, a silicon oxide layer 9 having substantially the same thickness as that of the wiring layer 3a is formed on the silicon oxide layer 2 and the silicon nitride layer 8 by using a CVD technique at normal pressure. At this time, a portion of the silicon oxide layer 9 which is on the wiring layer 3a and the remaining silicon nitride layer 8 protrudes over other parts of the layer. The sides of the protruding portion of the silicon oxide layer 9 are reversely sloped as indicated at 9a in FIG. 2C.

Figure 2D:
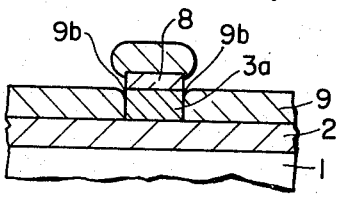

The whole of silicon oxide layer 9 is next lightly etched using a fluoric acid solution to remove the reversely sloped portions 9a to thereby form recesses 9b around the wiring layer 3a and the silicon nitride layer 8 as shown in FIG. 2D.

Figure 2E:
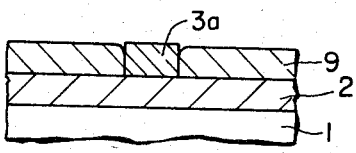
Figure 2F:
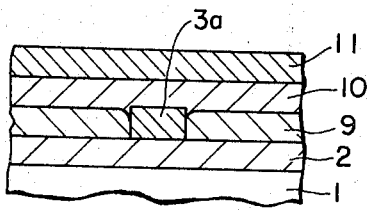

Then, the surface of this structure is subjected to a plasma such as a $CF_4$ gas plasma to etch away only the silicon nitride layer 8 and to lift off the silicon oxide layer on the etched silicon nitride layer 8 as shown in FIG. 2E. Following this etching, a silicon oxide layer 10 is formed on the surface of the structure as an insulating layer and thereafter through-holes (not shown) are formed in the silicon oxide layer 10 at predetermined positions over the wiring layer 3a. On the silicon oxide layer 10 formed with the through-hole, an aluminum layer 11 is vapor-deposited as a second wiring metal layer as shown in FIG. 2F. This second wiring metal layer 11 is connected via the through-holes to the wiring layer 3a.

Thus it will be evident that, by forming a silicon nitride layer on the first wiring layer of aluminum using CVD at normal pressure, lightly etching a silicon oxide layer formed on the structure and then etching away the remaining silicon nitride layer to flatten the surface, the second aluminum wiring layer formed on the flattened surface is prevented from breaking.

In the above embodiment, aluminum is used for the wiring metal. However, an aluminum alloy such as aluminum-silicon, aluminum-copper or aluminum-copper-silicon, tungsten, molybdenum or alloys of these such as molybdenum-silicon may be used for that purpose. Further, it is clear to those skilled in the art that the formation of such a metal layer may be performed by sputtering or ion plating.

What is claimed is:

1. A method for manufacturing a semiconductor device comprising the steps of:
    forming a first interconnection wiring metal layer an a semiconductor substrate;
    forming a silicon nitride layer only on wiring portions of said first wiring metal layer;
    selectively etching said metal layer to leave only said wiring portions on which said silicon nitride layer was formed;
    forming a silicon oxide layer on said silicon nitride layer and on said substrate adjacent said wiring portions;
    selectively removing only the silicon oxide layer overlying said metal wiring portions by etching;
    removing said silicon nitride layer;
    forming an insulating layer on a surface from which said silicon nitride layer was removed;
    forming through-holes in predetermined positions through said insulating layer; and
    forming a second wiring metal layer on said insulating layer, said second wiring metal connecting through said through-holes to said first wiring metal layer.

2. The method of claim 1 wherein said step of selectively removing said silicon oxide layer comprises: lightly etching said silicon oxide layer to form recesses around said wiring portions.

3. The method of claim 2 wherein said step of selectively etching comprises: chemical etching with a fluoric acid solution.

4. The method of any of claims 1 to 3 wherein said metal layer is formed of a material selected from the group consisting of aluminum, alloys of aluminum including aluminum-silicon, aluminum-copper and aluminum-copper-silicon, tungsten, molybdenum, and alloys of tungsten and molybdenum including molybdenum-silicon.

5. The method according to claim 1, wherein said step of selectively removing said silicon oxide layer comprises removing only the silicon oxide layer overlying said metal wiring portions.

6. The method according to claim 1, wherein the steps of selectively removing said silicon oxide layer and removing said silicon nitride layer are performed by plasma etching to thereby lift off said silicon nitride layer and only the portion of said silicon oxide layer overlying said silicon nitride layer.

* * * * *